United States Patent
Lim

(10) Patent No.: US 7,663,245 B2
(45) Date of Patent: Feb. 16, 2010

(54) INTERPOSER AND STACKED CHIP PACKAGE

(75) Inventor: Gwang-Man Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 378 days.

(21) Appl. No.: 11/446,971

(22) Filed: Jun. 6, 2006

(65) Prior Publication Data

US 2007/0120246 A1 May 31, 2007

(30) Foreign Application Priority Data

Nov. 25, 2005 (KR) .................. 10-2005-0113375

(51) Int. Cl.
*H01L 23/48* (2006.01)
(52) U.S. Cl. .............. 257/777; 257/685; 257/686; 257/723; 257/773; 257/778; 257/786; 257/E23.015; 257/E23.02; 257/E27.137; 257/E23.144; 257/E27.161; 257/E25.006; 257/E25.013; 257/E25.021; 257/E25.027; 257/E23.085
(58) Field of Classification Search ......... 257/666–735, 257/773–786, 772, E23.015, E23.02, E23.023–E23.079, 257/E27.137, E27.144, E27.161, E25.005, 257/E25.006, E25.021, E25.027, E23.085
See application file for complete search history.

(56) References Cited

U.S. PATENT DOCUMENTS

| 5,675,179 | A | * | 10/1997 | Shu et al. ................ 257/668 |
| 6,008,534 | A | * | 12/1999 | Fulcher ................... 257/691 |
| 6,137,168 | A | * | 10/2000 | Kirkman .................. 257/691 |
| 6,664,625 | B2 | * | 12/2003 | Hiruma .................... 257/700 |
| 7,057,292 | B1 | * | 6/2006 | Elenius et al. ............ 257/779 |
| 7,291,900 | B2 | * | 11/2007 | Corisis et al. ............. 257/666 |

FOREIGN PATENT DOCUMENTS

| JP | 4-28253 | * | 1/1992 | .......... 257/692 |
| JP | 5-62978 | * | 3/1993 | .......... 257/778 |
| JP | 2001-007278 | | 1/2001 | |
| JP | 2004-235352 | | 8/2004 | |
| KR | 1020010062929 A | | 7/2001 | |

* cited by examiner

*Primary Examiner*—Jasmine J Clark
(74) *Attorney, Agent, or Firm*—Harness, Dickey & Pierce, PLC

(57) ABSTRACT

An interposer may include a base substrate supporting an array of conductive lands. The conductive land may have an identical shape and size. The conductive lands may be provided at regular intervals on the base substrate. The conductive land pitch may be determined such that adjacent conductive lands may be electrically connected by one end of an electric connection member. Alternatively, each conductive land may provide respective bonding locations to which ends of two different electric connection members may be bonded. A stacked chip package may include an interposer that may be fabricated by cutting an interposer to size. In the stacked chip package, electrical connections may be made through the interposer between an upper semiconductor chip and a package substrate, between the upper semiconductor chip and a lower semiconductor chip, and/or between the lower semiconductor chip and the package substrate.

27 Claims, 14 Drawing Sheets

INTERPOSER AND STACKED CHIP PACKAGE

PRIORITY STATEMENT

This U.S. non-provisional application claims benefit of priority under 35 U.S.C.§119 from Korean Patent Application No. 2005-113375, filed on Nov. 25, 2005, the entire contents of which are incorporated herein by reference.

BACKGROUND

1. Field of the Invention

Example embodiments of the present invention relate generally to an interposer and a stacked chip package having an interposer and, more particularly, to an interposer that may have a plurality of regularly formed lands, and to a stacked chip package that may implement such an interposer.

2. Description of the Related Art

Package stacking technologies may involve stacking multiple semiconductor chips to achieve a high degree of integration in semiconductor devices. Due to conditions such as the sizes of the semiconductor chips to be stacked and/or the number or arrangement of chip pads thereof (for example), the chip pads of an upper semiconductor chip may be reconfigured to be stacked on a lower semiconductor chip.

An interposer may be implemented to reconfigure the chip pads of the upper semiconductor chip. Although the conventional interposer is generally thought to provide acceptable performance, it is not with shortcomings. For example, according to conventional wisdom, the interposer may be separately fabricated (and customized) according to assembly conditions of semiconductor chips and a package substrate of a particular stacked chip package.

FIGS. 1A and 1B illustrate a stacked chip package that implement a conventional interposer.

As shown in FIGS. 1A and 1B, the conventional stacked chip package 1 may include a package substrate 2. A first semiconductor chip 3 may be mounted on the package substrate 2. An interposer 5 may be stacked on the first semiconductor chip 3. A second semiconductor chip 4 may be stacked on the interposer 5.

In the stacked chip package 1, an adhesive 12 may provide bonds between the package substrate 2 and first semiconductor chip 3, between the first semiconductor chip 3 and interposer 5, and between the interposer 5 and second semiconductor chip 4.

Substrate pads 6 may be provided on the upper surface of the package substrate 2. The substrate pads 6 may be electrically connected to corresponding first chip pads 7 provided on the upper surface of the first semiconductor chip 3 through bonding wires 11.

Second chip pads 8 may be provided on the upper surface of the second semiconductor chip 4. The second chip pads 8 may be electrically connected to corresponding substrate pads 6 through a first bonding pad 9a, a second bonding pad 9b, and connection wires 10 that may be provided on the upper surface of the interposer 5.

By virtue of the interposer 5, a second chip pad 8 need not be directly connected to a corresponding substrate pad 6 through a lengthy bonding wire. Instead, the second bonding pad 9b may be connected to an associated second chip pad 8 through a bonding wire 11. The second bonding pad 9b may be electrically connected to the first bonding pad 9a through the connection wire 10. The connection wire 10 may have a predetermined pattern on the upper surface of the interposer 5. The first bonding pad 9a may be connected to a corresponding substrate pad 6 through another bonding wire 11.

The first bonding pads 9a, the second bonding pads 9b and the connection wires 10, which may be implemented to reconfigure the second chip pads 8, may be custom fabricated according to fabrication conditions of the stacked chip package 1, such as the number and arrangement of the substrate pads 6, the number and arrangement of the chip pads 7 and 8, and/or the sizes of the semiconductor chips 3 and 4, for example.

That is, to interconnect the second bonding pads 9b and the second chip pads 8, the second bonding pads 9b may be provided corresponding in number and position to the second chip pads 8. Similarly, the first bonding pads 9a may be provided corresponding to the substrate pads 6.

The connection wires 10, each of which may interconnect a first bonding pad 9a and an associated second bonding pad 9b, may have predetermined patterns corresponding to the arrangement of the first bonding pads 9a and the second bonding pads 9b.

If fabrication conditions of the stacked chip package 1 are altered, for example, an increase in number and/or a change in position of the first chip pads 7 and the second chip pads 8 or a change in size of the second semiconductor chip 4 to be stacked, then a new (and customized) interposer may be fabricated according to the changed fabrication conditions.

The custom fabrication of interposers according to fabrication conditions of individual stacked chip packages may increase overall package manufacturing costs and/or adds extra steps to an overall package manufacturing process.

SUMMARY

According to an example, non-limiting embodiment, an interposer may include a base substrate. A two dimensional array of conductive lands may be provided on a surface of the base substrate. The conductive lands may be identical in shape and arranged at a uniform pitch in at least one direction.

According to another example, non-limiting embodiment, a stacked chip package may include a package substrate supporting a plurality of substrate pads. A first semiconductor chip may be stacked on the package substrate and may support first chip pads. A second semiconductor chip may be stacked on the package substrate and may support second chip pads. An interposer may be stacked on the package substrate. Some of the second chip pads may be electrically connected to corresponding substrate pads via at least two connection members. Two of the at least two connection members may be electrically interconnected through a first conductive land located between a second conductive land and a third conductive land by bonding one end of each of the two connection members to the second conductive land and the third conductive land, respectively, so that the ends of the two connection members may contact with the first contact land.

According to another example, non-limiting embodiment, a stacked chip package may include a package substrate supporting a plurality of substrate pads. A first semiconductor chip may be stacked on the package substrate and may support first chip pads. A second semiconductor chip may be stacked on the package substrate and may support second chip pads. An interposer may be stacked on the package substrate. Some of the second chip pads may be electrically connected to corresponding substrate pads via at least two connection members. Two of the at least two connection members may be electrically interconnected by bonding one end of each of the two connection members to a first bonding portion and a second bonding portion, respectively, of an associated conductive land.

BRIEF DESCRIPTION OF THE DRAWINGS

Example, non-limiting embodiments of the present invention will be readily understood with reference to the following detailed description thereof provided in conjunction with the accompanying drawings, wherein like reference numerals designate like structural elements.

The drawings are provided for illustrative purposes only and are not drawn to scale. The spatial relationships and relative sizing of the elements illustrated in the various embodiments may have been reduced, expanded or rearranged to improve the clarity of the figure with respect to the corresponding description. The figures, therefore, should not be interpreted as accurately reflecting the relative sizing or positioning of the corresponding structural elements that could be encompassed by an actual device manufactured according to the example, non-limiting embodiments of the invention.

DESCRIPTION OF EXAMPLE, NON-LIMITING EMBODIMENTS

Example, non-limiting embodiments of the present invention will be described more fully with reference to the accompanying drawings. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

Well-known structures and processes are not described or illustrated in detail to avoid obscuring the present invention.

An element is considered as being mounted (or provided) "on" another element when mounted or provided) either directly on the referenced element or mounted (or provided) on other elements overlaying the referenced element. Throughout this disclosure, spatial terms such as "upper," "lower," "above" and "below" (for example) are used for convenience in describing various elements or portions or regions of the elements as shown in the figures. These terms do not, however, require that the structure be maintained in any particular orientation.

Figure 1A:
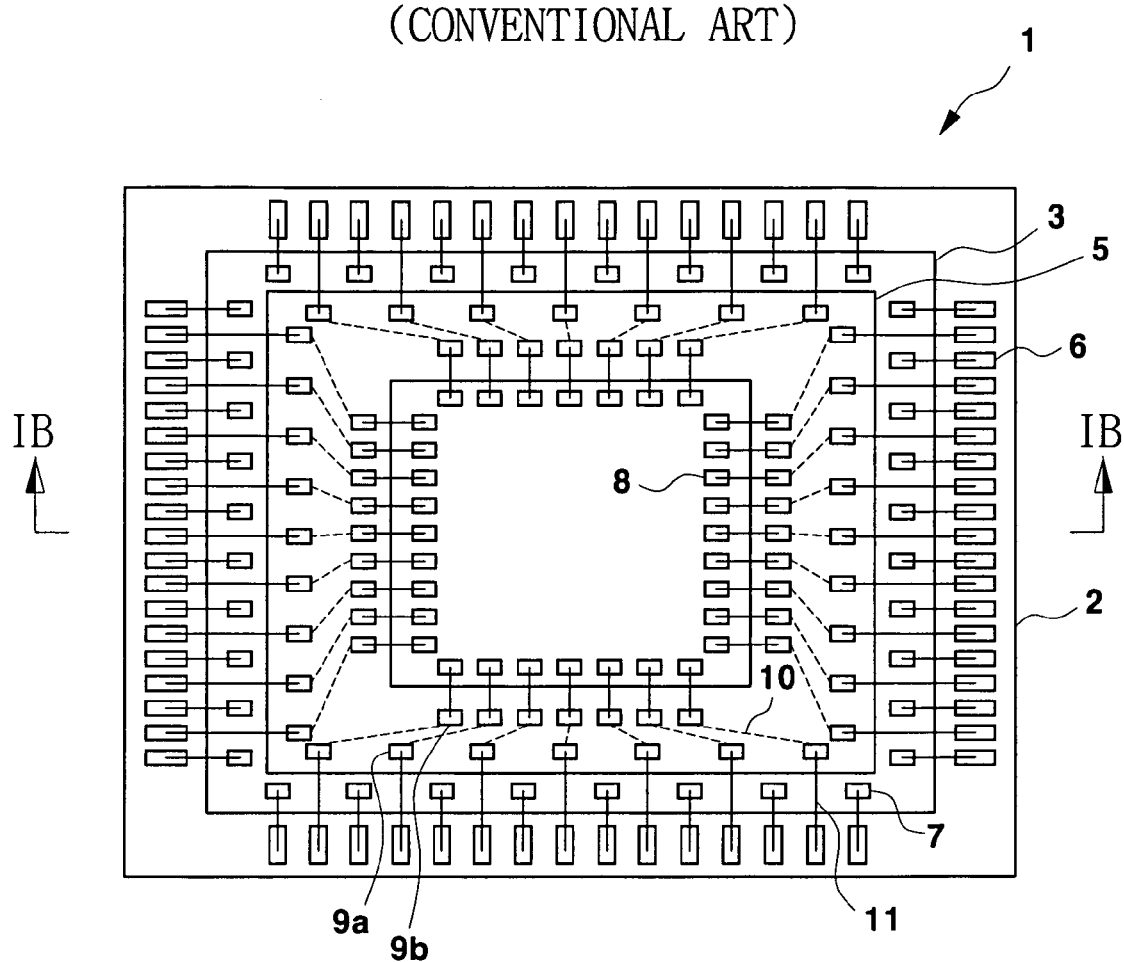
FIG. 1A is a top view of a stacked chip package having a conventional interposer.
Figure 1B:
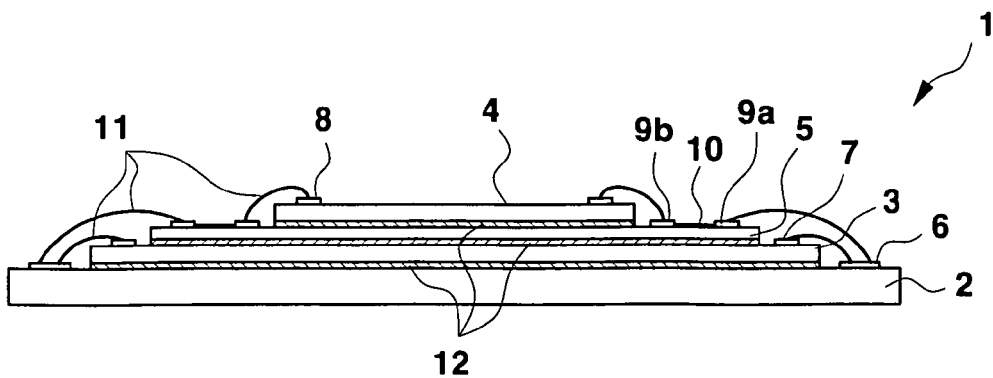
FIG. 1B is a sectional view of the stacked chip package taken along the line IB-IB in FIG. 1A.
Figure 2A:
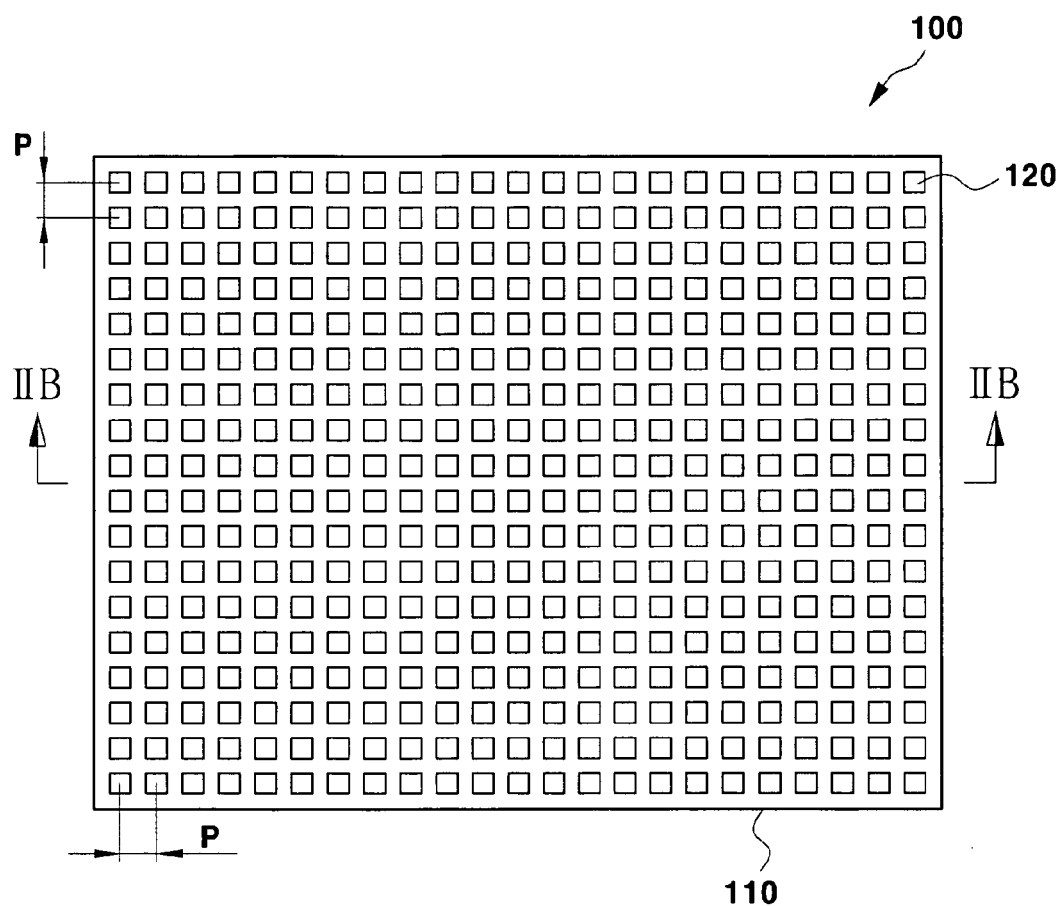
FIG. 2A is a top view of an interposer according to an example, non-limiting embodiment of the present invention.
Figure 2B:
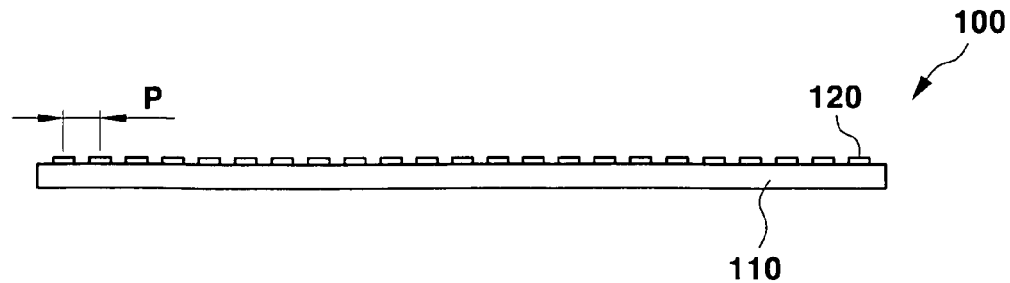
FIG. 2B is a sectional view of the interposer taken along the line IIB-IIB in FIG. 2A.

FIGS. 2A and 2B are top and sectional views of an interposer according to an example, non-limiting embodiment of the present invention.

As shown in FIG. 2A, the interposer 100 may include a base substrate 110, and a plurality of conductive lands 120 may be provided on the base substrate 110. The lands 120 may be fabricated from a metal, for example. By way of example only, the metal lands 120 may be identical in shape and size. The metal lands 120 shown in FIG. 2A may have a square shape, for example.

In alternative embodiments, the lands 120 may have various shapes and/or sizes.

The base substrate 110 may be fabricated from an insulating material such as a polyimide tape, a printed circuit board and/or a silicon wafer, for example. The base substrate 110 may be cut to size.

The lands 120 may be provided at an identical pitch P (the distance between centers of two adjacent metal lands in FIG. 2A) and over the entire upper surface of the base substrate 110 in the form of a lattice, for example. In alternative embodiments, the lands 120 may be provided at varied pitches.

By way of example only, the lands 120 may be fabricated by forming a metal film (not shown) on the base substrate 110 through lamination and/or electroplating, forming photo-resist patterns in the form of a lattice as shown in FIG. 2A, and performing a photo-etch process.

Figure 3A:
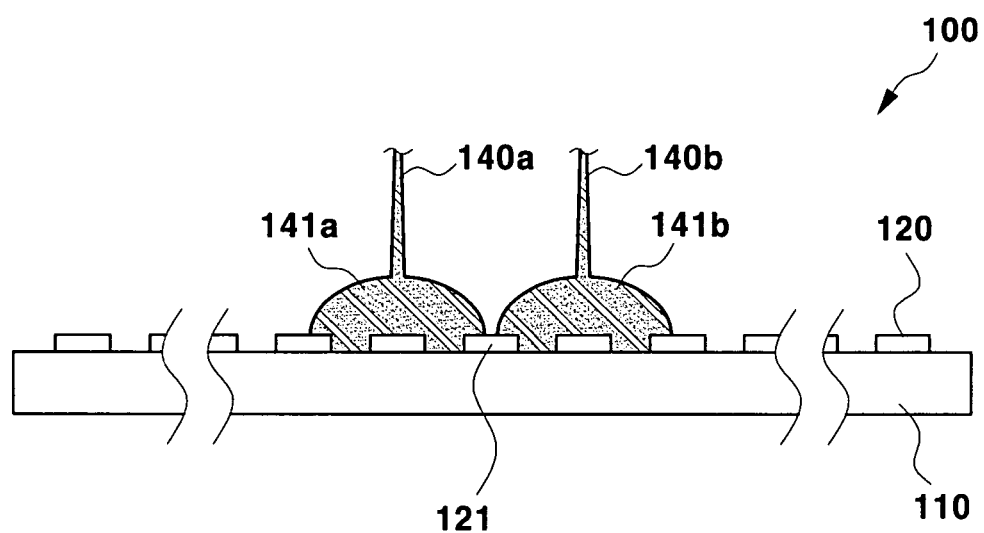
FIGS. 3A and 3B are partial sectional and partial top views of an electrical connection scheme of connection members and the interposer shown in FIGS. 2A and 2B.
Figure 3B:
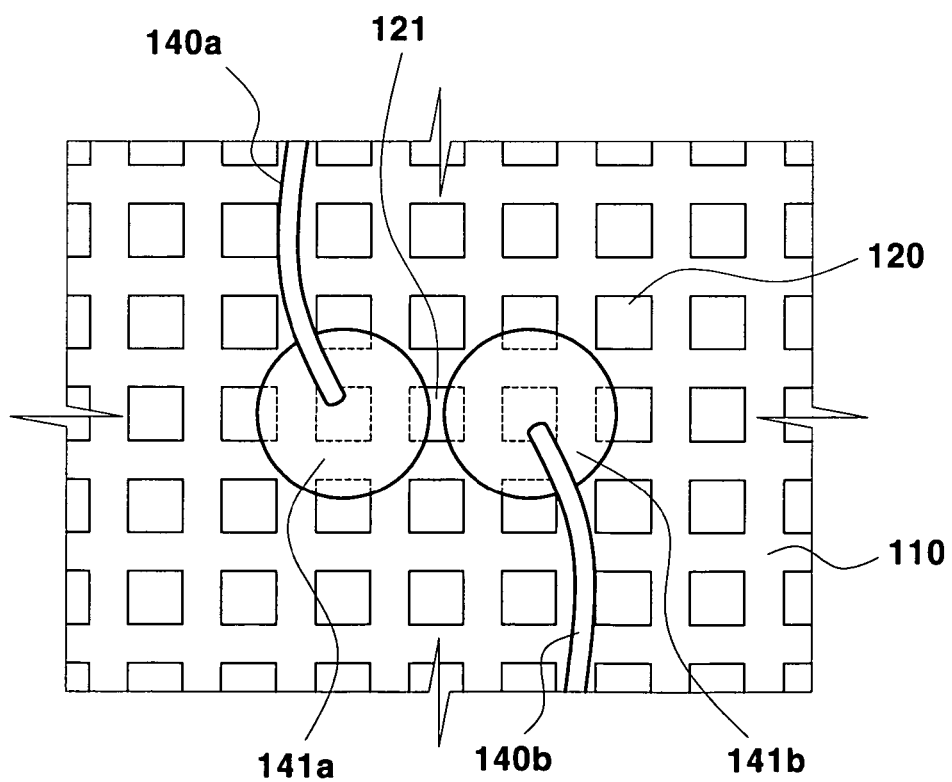

Electrical connections between the lands 120 may be achieved as shown in FIGS. 3A and 3B, for example.

As shown in FIGS. 3A and 3B, the pitch P between the lands 120 may be determined in such a manner that, when connection members (e.g., a bonding wire 140a and a bonding wire 140b) are bonded to corresponding lands 120, the connection members (e.g., the bonding wire 140a and the bonding wire 140b) may be electrically connected by a common land 121. By way of example only, a wire ball 141a at one end of the bonding wire 140a and a wire ball 141b at one end of the bonding wire 140b may be bonded to the common land 121.

In this way, the two bonding wires 140a and 140b may be electrically interconnected through the common land 121 among the lands 120.

As described above, the pitch P between the lands 120 may not be fixed at a particular value, and a common land 121 may be in electrical contact with the bonding wires 140a and 140b.

Figure 4A:
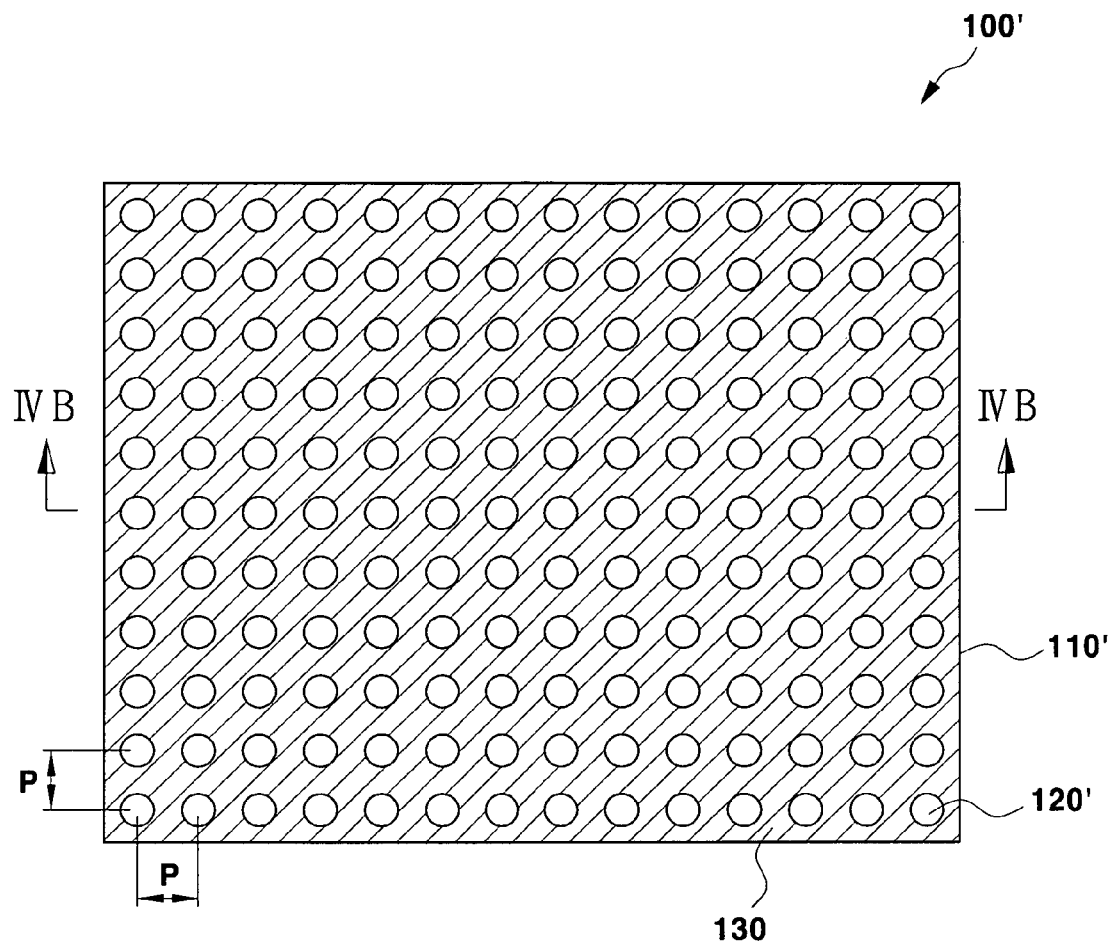
FIG. 4A is a top view of a modified example of the interposer according to an example, non-limiting embodiment of the present invention.
Figure 4B:
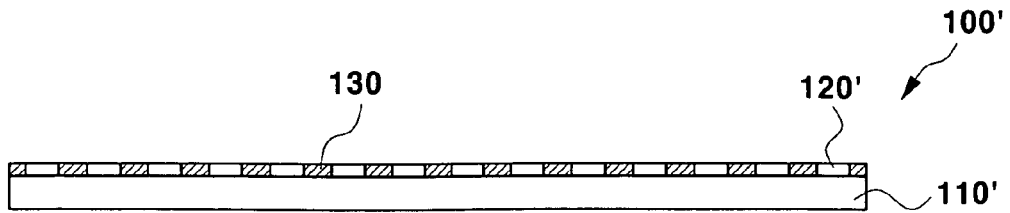
FIG. 4B is a sectional view of the interposer taken along the line IVB-IVB in FIG. 4A.

FIGS. 4A and 4B show a modified example of the interposer. Here, the interposer 100' may include a base substrate 110' that may support round lands 120'. Spaces between the metal lands 120' may be filled with an insulating material 130. The insulating material 130 may have the same thickness as the metal lands 120', and thus the interposer 100' may present a flat upper surface.

The spaces between the metal lands 120' may be filled with an insulating material 130 to planarize an interfacial surface, which may facilitate bonding between the connection members and the lands 120'.

Figure 5A:
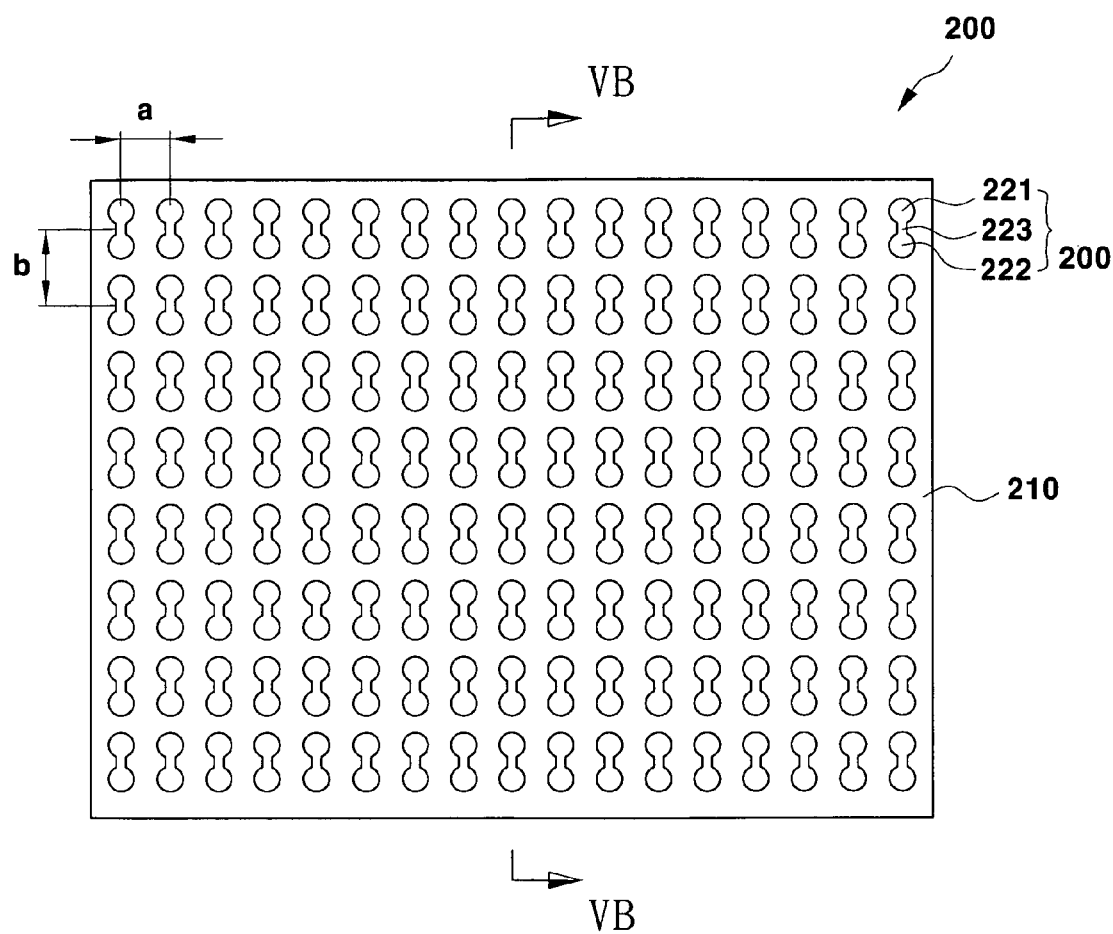
FIG. 5A is a top view of an interposer according to another example, non-limiting embodiment of the present invention.
Figure 5B:
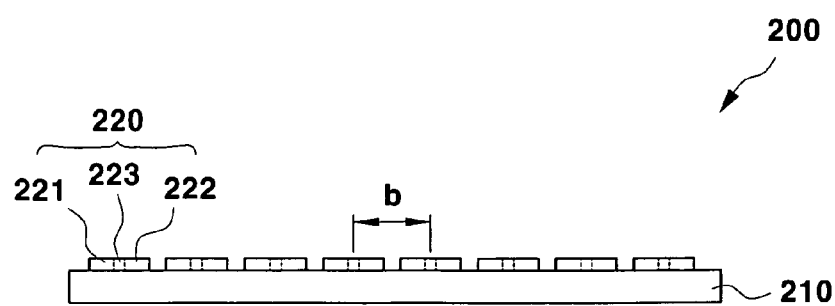
FIG. 5B is a sectional view of the interposer taken along the line VB-VB in FIG. 5A.

FIGS. 5A and 5B are top and sectional views of an interposer according to another example embodiment of the present invention.

As shown in FIGS. 5A and 5B, the interposer 200 may include a base substrate 210. A plurality of lands 220 may be provided over the entire upper surface of the base substrate 210. Each of the lands 220 may include a first bonding portion 221, a second bonding portion 222, and a connecting portion 223.

Each land 220 may include the first bonding portion 221 and the second bonding portion 222 to which connection members may be respectively bonded. The connecting portion 223 may interconnect the first bonding portion 221 and the second bonding portion 222. By way of example only, the first bonding portion 221 and the second bonding portion 222 may be round and identical in size, and the connecting portion 223 may have a rectangular shape with a width that may be smaller than the diameter of the first bonding portion 221 and the second bonding portion 222. Thus, the land 220 may have the shape of a dumbbell.

The lands 220 may be provided in lines that extend across the entire upper surface of the base substrate 210. That is, the lands 220 may be provided at regular intervals "a" parallel to one of two adjacent sides of the base substrate 210 and at regular intervals "b" parallel to the other. The intervals "a" and "b" may be the same as, or different from, each other. Here, the interval "a" may refer to the distance between centers of the first bonding portions 221 and/or between centers of the second bonding portions 222, and the interval "b" may refer to the distance between centers of the connecting portions 223. In alternative embodiments, the intervals "a" and "b" may be varied in a given interposer.

The first bonding portion 221 and the second bonding portion 222 may have the shape of a circle or a polygon, such as a triangle or a rectangle (for example, and may differ in size. Each land 220 may provide two bonding areas and the lands 220 may have the same shape and may be distributed at regular intervals over the entire upper surface of the base substrate 210. The first bonding portion 221, the second bonding portion 222 and the connecting portion 223 of a land 220 may be changed in shape and/or size.

Figure 6A:
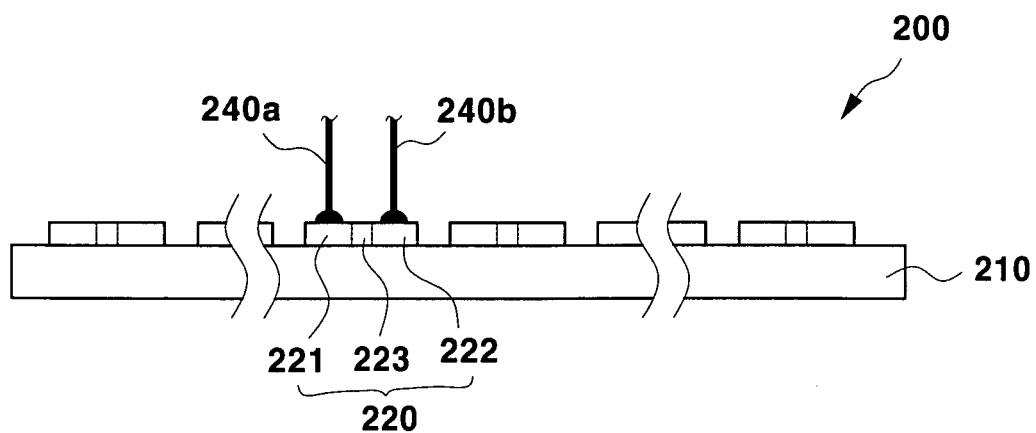
FIGS. 6A and 6B are partial sectional and partial top views of an electrical connection scheme of connection members and the interposer shown in FIGS. 5A and 5B.
Figure 6B:
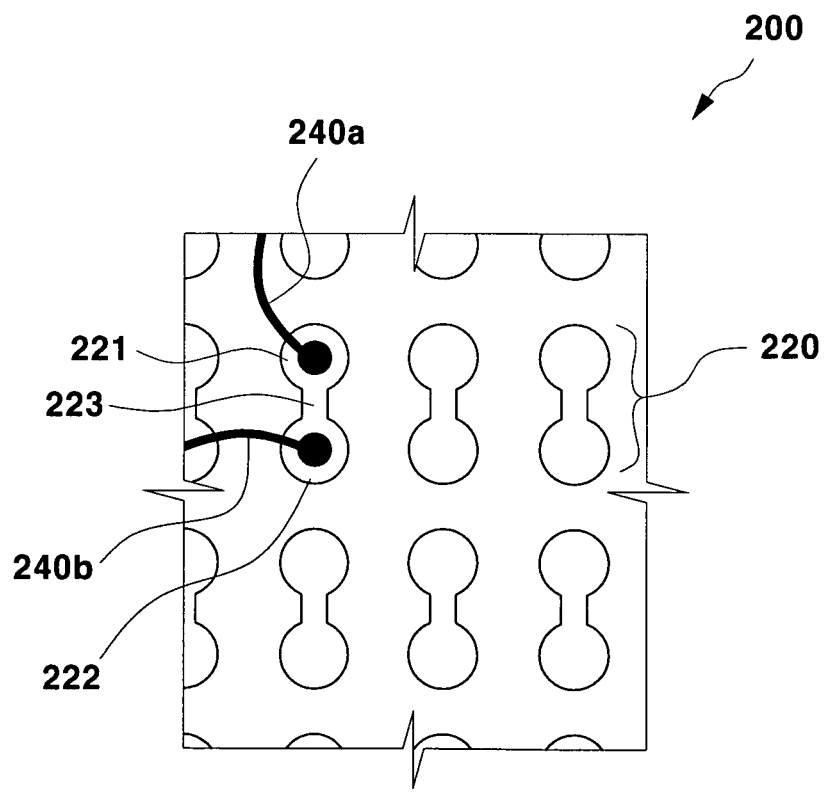

FIGS. 6A and 6B show electrical connections between lands 220 of the interposer.

As shown in FIGS. 6A and 6B, two connection members (e.g., bonding wires 240a and 240b) may be bonded to the first and the second bonding portions 221 and 222 of a land 220, respectively. The two bonding wires 240a and 240b may be electrically connected by the connecting portion 223 of the land 220.

Compared with the previous example embodiment wherein the two bonding wires 140a and 140b may be electrically connected by the common land 121, in this example embodiment, the two bonding wires 240a and 240b may be electrically connected by the connecting portion 223 of the land 220.

Hereinafter, stacked chip packages that may implement an interposer according to example embodiments of the present invention will be described.

Figure 7A:
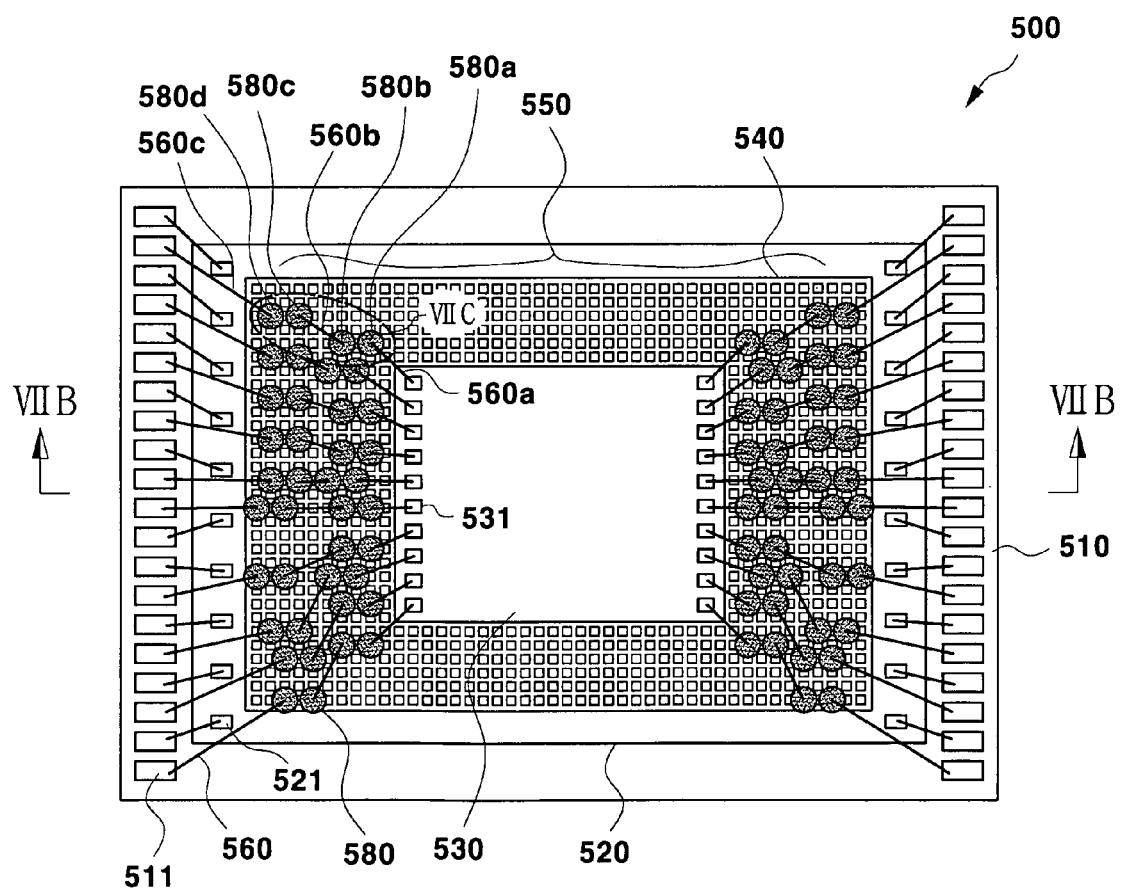
FIG. 7A is a top view of a stacked chip package according to an example, non-limiting embodiment of the present invention.
Figure 7B:
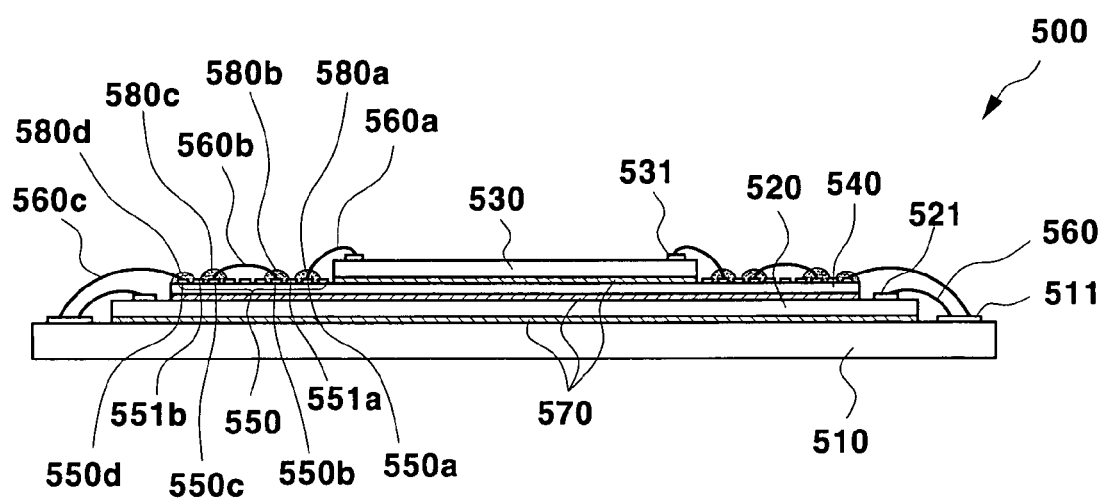
FIG. 7B is a sectional view of the stacked chip package taken along the line VIIB-VIIB in FIG. 7A.
Figure 7C:
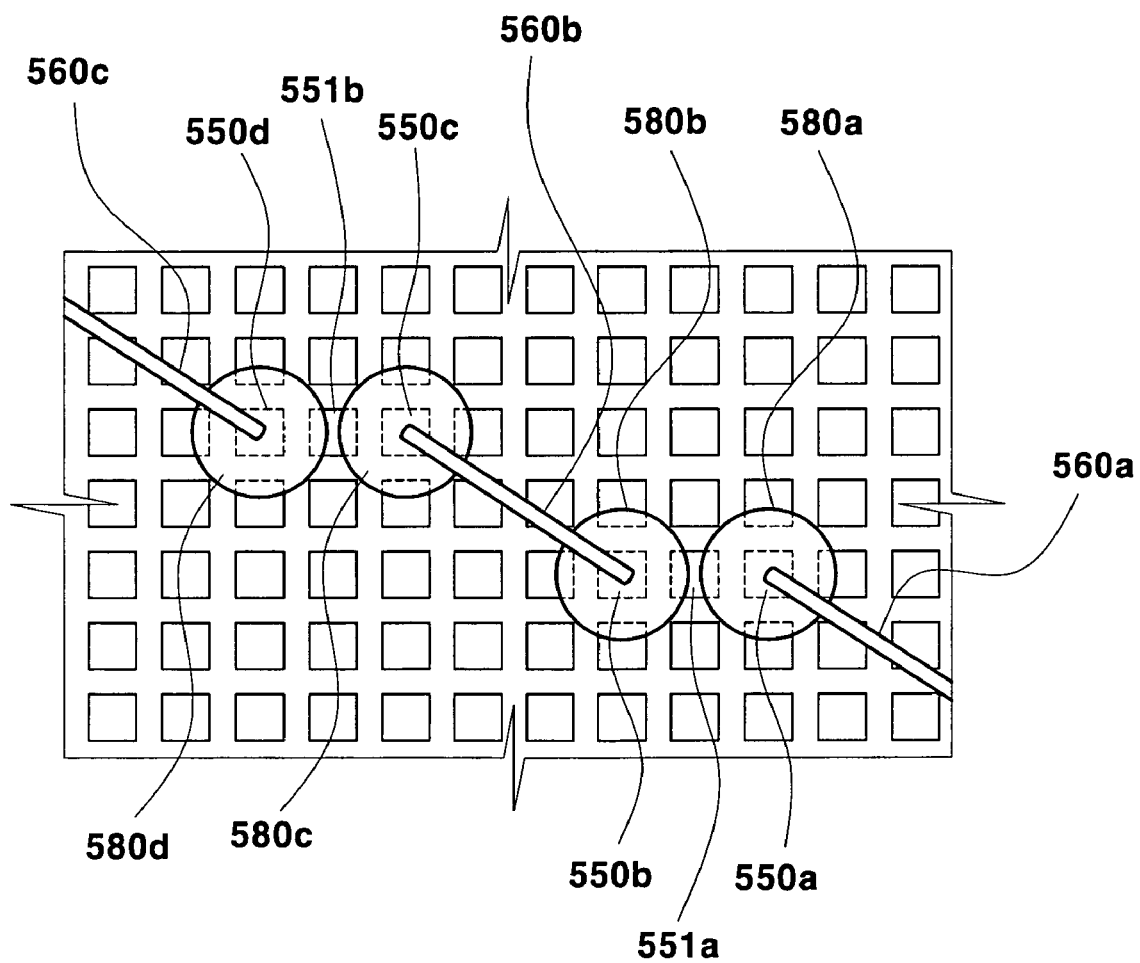
FIG. 7C is an enlarged top view of a portion VIIC of the stacked chip package of FIG. 7A.

FIGS. 7A to 7C are top, sectional and partially enlarged top views of a stacked chip package according to an example, non-limiting embodiment of the present invention.

In FIGS. 7A to 7C, wire balls (580, 580a, 580b and 580c), lands (550, 550a, 550b and 550c) and other features are illustrated in an exaggerated form to clearly depict electrical connections through the lands provided on an interposer 540.

As shown in FIGS. 7A to 7C, the stacked chip package 500 may include a package substrate 510 supporting substrate pads 511. A first semiconductor chip 520 may be stacked on the package substrate 510. An interposer 540 may be stacked on the first semiconductor chip 520. A second semiconductor chip 530 may be stacked on the interposer 540. In the stacked chip package 500, an adhesive 570 may be implemented to provide bonds between the package substrate 510 and the first semiconductor chip 520, between the first semiconductor chip 520 and the interposer 540, and between the interposer 540 and the second semiconductor chip 530.

First chip pads 521 may be provided on the upper surface of the first semiconductor chip 520. Second chip pads 531 may be provided on the upper surface of the second semiconductor chip 530. A plurality of lands 550 may be provided on the upper surface of the interposer 540. In this example embodiment, the interposer 100 (depicted in FIGS. 2A and 2B) may be cut to size to fabricate the interposer 540 that may be implemented in the stacked chip package 500.

The first chip pads 521 may be electrically connected to corresponding substrate pads 511 through bonding wires 560 (for example). The second chip pads 531 may be electrically connected to corresponding substrate pads 511 via the lands 550 on the interposer 540.

The electrical path from a second chip pad 531 to a corresponding substrate pad 511, as shown in FIG. 7C, may be provided as follows. The second chip pad 531 may be bonded, by ball bonding (for example), to an associated first land 550a using a first bonding wire 560a. That is, a first wire ball 580a may be provided at one end of the first bonding wire 560a and bonded to the first land 550a. A capillary (not shown) may be moved and the other end of the first bonding wire 560a may be bonded, by ball bonding or stitch bonding (for example), to the second chip pad 531.

The first bonding wire 560a ball-bonded to the first land 550a and a second bonding wire 560b ball-bonded to a second land 550b may be electrically connected together by a first common land 551a situated between the first land 550a and the second land 550b.

The second bonding wire 560b may be ball-bonded to the second land 550b to provide a second wire ball 580b on the second land 550b. A portion of the second wire ball 580b may be bonded to the first common land 551a, to which a portion of the first wire ball 580a may also be bonded. Consequently, the first bonding wire 560a and the second bonding wire 560b may be electrically connected through the first wire ball 580a, the first common land 551a and the second wire ball 580b. The second bonding wire 560b may be ball-bonded to a third land 550c on the interposer 540 to provide a third wire ball 580c on the third land 550c. The second bonding wire 560b may electrically interconnect the second and the third lands 550b and 550c on the interposer 540.

The second bonding wire 560b may be electrically connected to a third bonding wire 560c, which may be ball-bonded to a fourth land 550d, through a second common land 551b situated between the third land 550c and the fourth land 550d and to which a portion of the third wire ball 580c may be bonded. One end of the third bonding wire 560c may be ball-bonded to the fourth land 550d to provide a fourth wire ball 580d, a portion of which may also be bonded to the second common land 551b. Consequently, the third wire ball 580c and the fourth wire ball 580d may be electrically connected together by the second common land 551b, thereby electrically interconnecting the second bonding wire 560b and the third bonding wire 560c.

The other end of the third bonding wire 560c may be bonded, by ball bonding or stitch bonding (for example), to the corresponding substrate pad 511.

The electrical connection path from the second chip pad 531 to the corresponding substrate pad 511 may be summarized in sequence as follows: second chip pad 531→first bonding wire 560a→first land 550a→first common land 551a→second land 550b→second bonding wire 560b→third land 550c→second common land 551b→fourth land 550d→third bonding wire 560c→substrate pad 511.

Although the stacked chip package 500 may include a bonding wire interconnecting lands 550 on the interposer 540, such as the second bonding wire 560b interconnecting the lands 550b and 550c, the stacked chip package 500 may include no or multiple bonding wires interconnecting lands 550 on the interposer 540.

In addition, a first chip pad 521 may be electrically connected to an associated second chip pad 531 via a land 550.

By virtue of the interposer according to example, non-limiting embodiments of the present invention, even if the number of chip pads of a semiconductor chip and/or the number of substrate pads in the stacked chip packages increases, it is possible to fabricate the stacked chip packages implementing interposers by cutting an interposer (as shown in FIGS. 2A and 2B, for example) to size.

In a stacked chip package having an interposer according to example embodiments of the present invention, a plurality of lands may be provided on the interposer. If the lands are used to form electrical connections as described above, it may be possible to connect the chip pads (as desired) of an upper semiconductor chip to corresponding substrate pads. As a result, even if conditions concerning the number of chip pads are changed, it may be possible to fabricate stacked chip packages implementing interposers that may be cut to size, and without fabricating separate custom interposers according to the changed conditions.

Figure 8A:
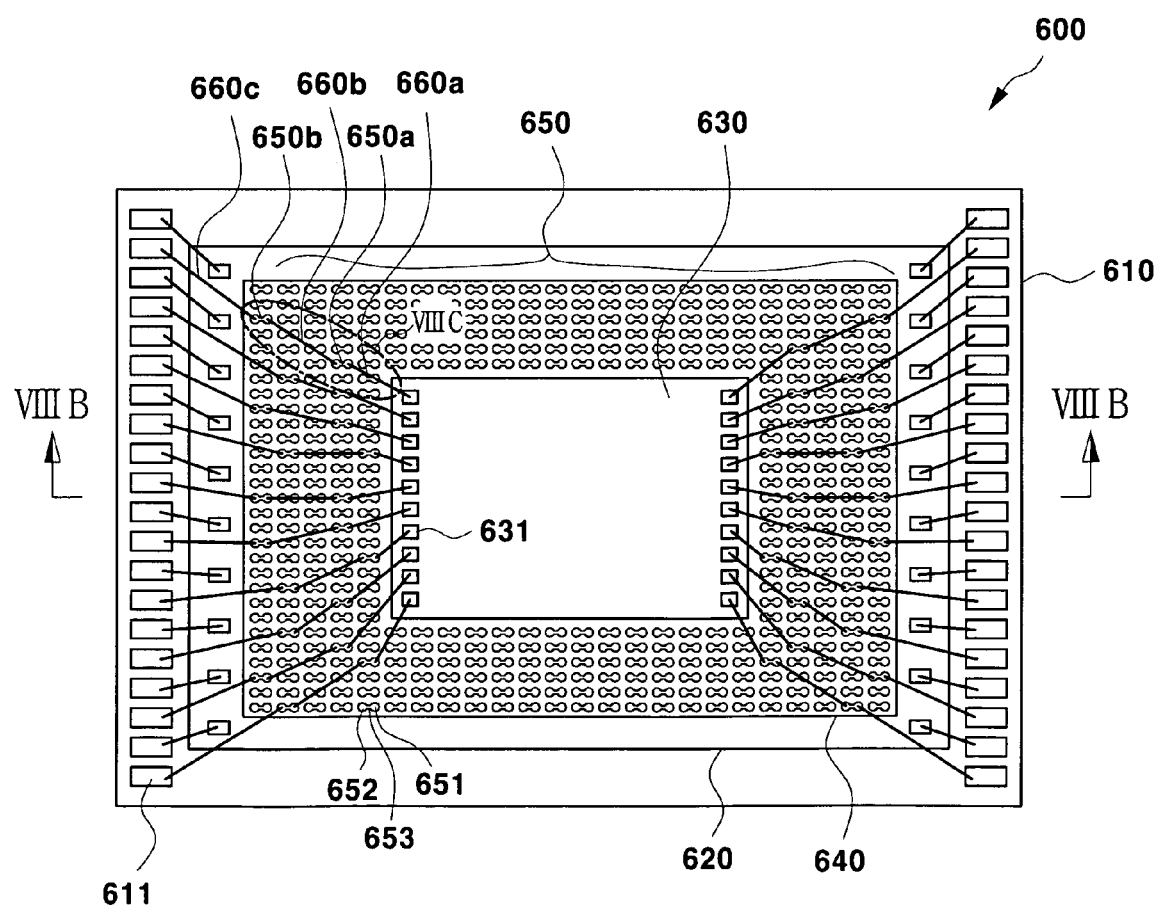
FIG. 8A is a top view of a stacked chip package according to another example, non-limiting embodiment of the present invention.
Figure 8B:
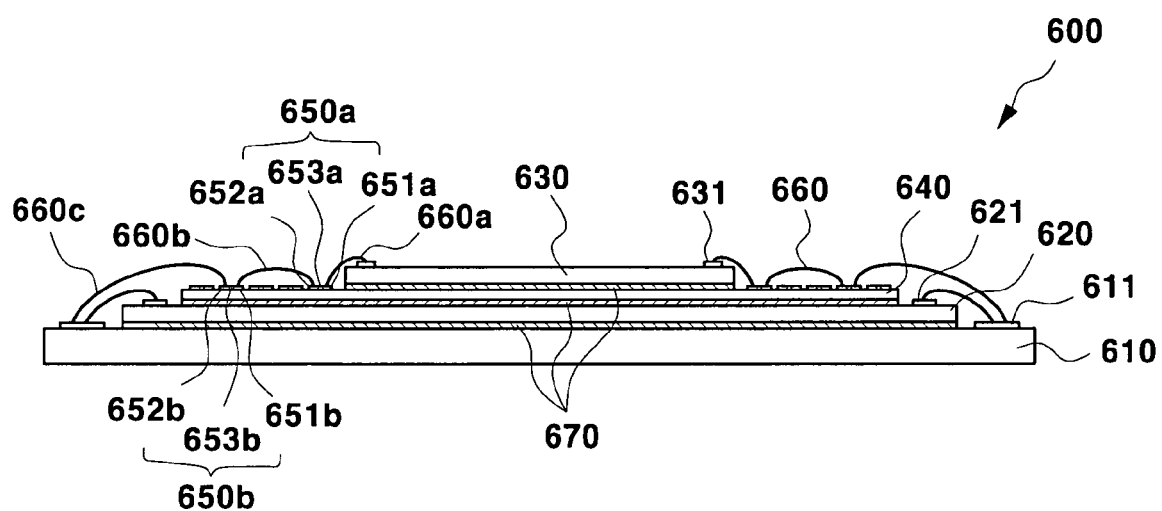
FIG. 8B is a sectional view of the stacked chip package taken along the line VIIIB-VIIIB in FIG. 8A.
Figure 8C:
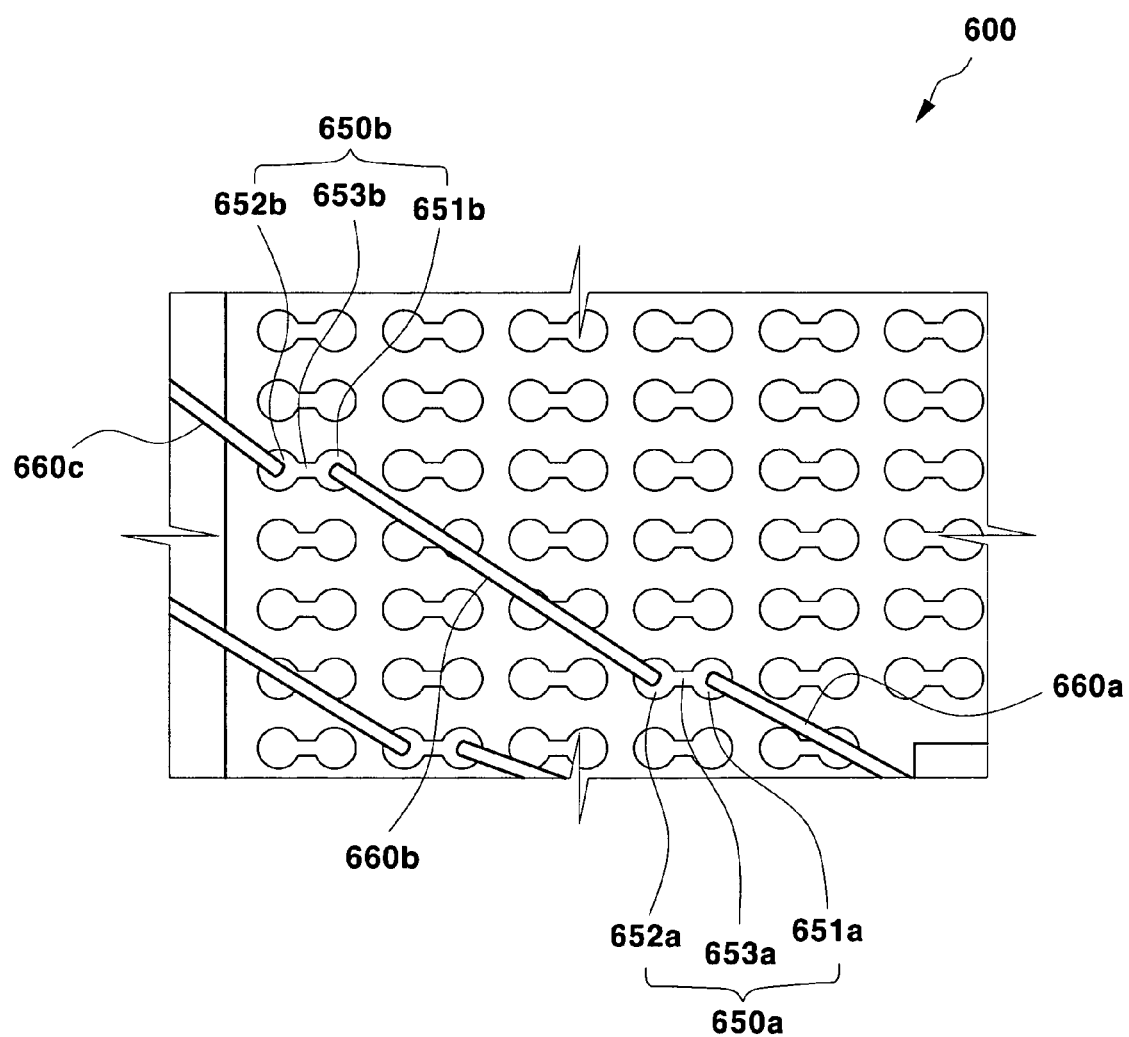
FIG. 8C is an enlarged top view showing a portion VIIIC of the stacked chip package of FIG. 8A.

FIGS. 8A to 8C are top, sectional and partially enlarged views of a stacked chip package according to another example, non-limiting embodiment of the present invention.

As shown in FIGS. 8A to 8C, the stack chip package 600 may include a package substrate 610, a first semiconductor chip 620, an interposer 640 and a second semiconductor chip 630 that may be similar to the stacked chip package 500 of the previous example embodiment, and therefore a description of the same is omitted. But there may be some notable differences.

For example, the interposer 640 may be fabricated by cutting the interposer 200 (of FIGS. 5A and 5B) to size.

Electrical connections between the substrate pads 611 and the first chip pads 621 may be achieved in the same manner as those in the stacked chip package 500 of the previous example embodiment, and thus a description of the same is omitted. Electrical connections between the substrate pads 611 and the second chip pads 631 are described below.

The second chip pad 631 may be connected to a first land 650a on the interposer 640 through a first bonding wire 660a (for example). One end of the first bonding wire 660a may be bonded, by ball bonding or stitch bonding (for example), to the second chip pad 631, and the other end may be bonded, by ball bonding or stitch bonding (for example), to the first bonding portion 651a of the first land 650a.

One end of a second bonding wire 660b may be bonded to a second bonding portion 652a of the first land 650a. Because the first bonding portion 651a and the second bonding portion 652a may be electrically connected by a connecting portion 653a of the first land 650a, the first bonding wire 660a may be electrically connected to the second bonding wire 660b through the connecting portion 653a.

The other end of the second bonding wire 660b may be bonded to a first bonding portion 651b of a second land 650b. As a result, the first land 650a and the second land 650b may be electrically interconnected through the second bonding wire 660b.

One end of a third bonding wire 660c may be bonded to the corresponding substrate pad 611, and the other end may be bonded to a second bonding portion 652b of the second land 650b. The first bonding portion 651b and the second bonding portion 652b may be electrically connected by a connecting portion 653b of the second land 650b, and thus the substrate pad 611 may be electrically connected to the second land 650b through the third bonding wire 660c.

The electrical connection path from the second chip pad 631 to the corresponding substrate pad 611 may be summarized in sequence as follows: second chip pad 631→first bonding wire 660a→first bonding portion 651a of first land 650a→connecting portion 653a of first land 650a→second bonding portion 652a of first land 650a→second bonding wire 660b→first bonding portion 651b of second land 650b→connecting portion 653b of second land 650b→second bonding portion 652b of second land 650b→third bonding wire 660c→substrate pad 611.

Figure 9A:
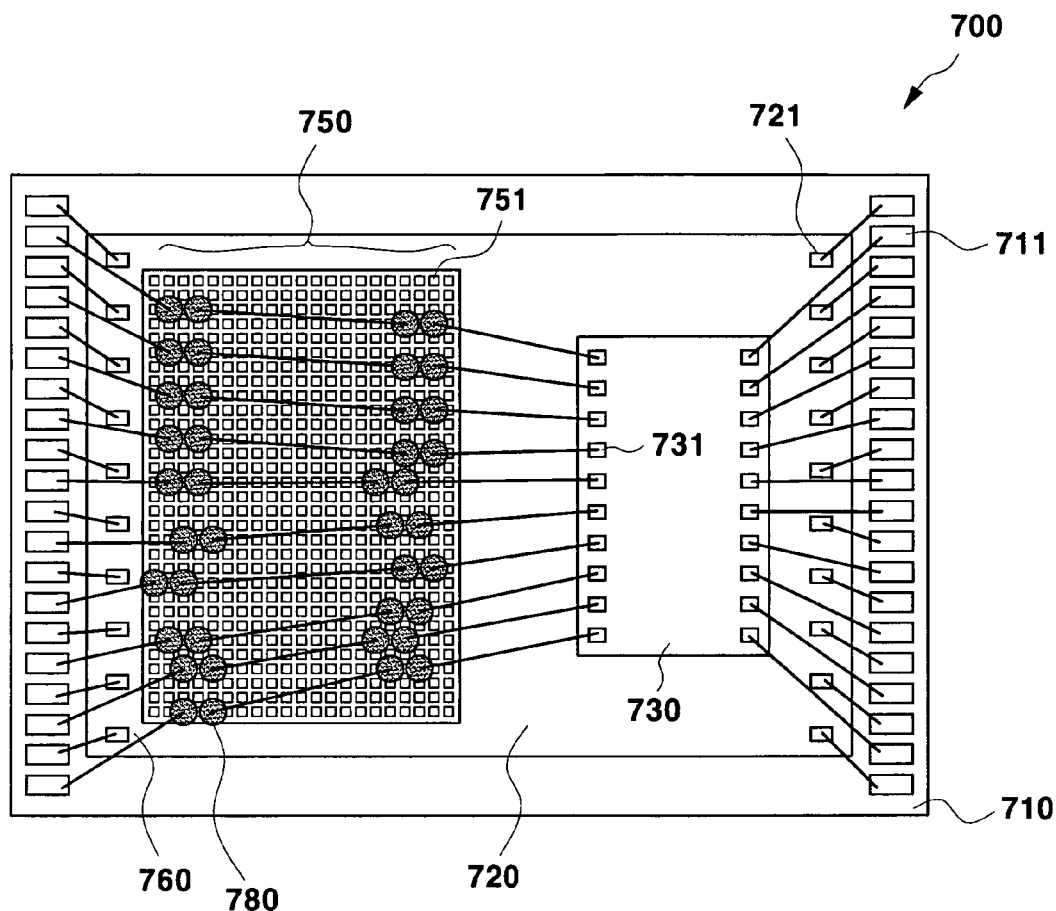
FIGS. 9A and 9B are top and sectional views of a modified example of the stacked chip package according to an example, non-limiting embodiment of the present invention.
Figure 9B:
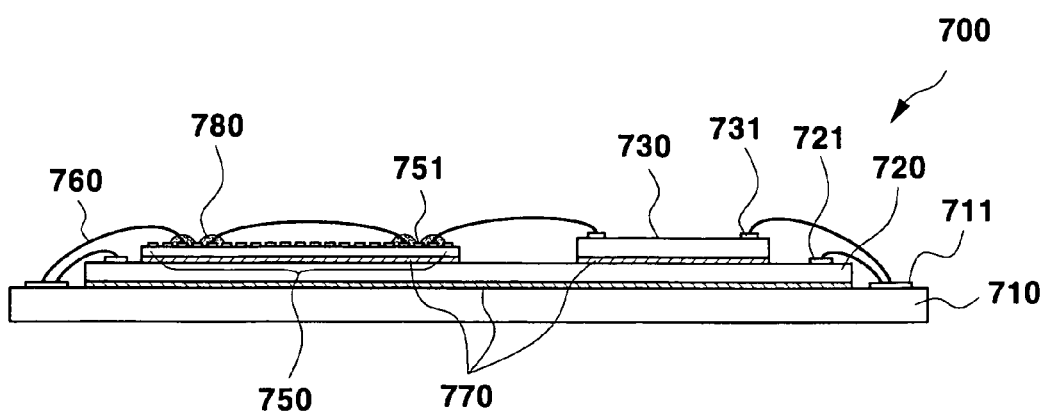

FIGS. 9A and 9B are top and sectional views of a modified example of the stacked chip package according to an example, non-limiting embodiment of the present invention.

The stacked chip package 700 shown in FIGS. 9A and 9B may include an interposer 750 and a second semiconductor chip 730 that may be mounted parallel to each other on the upper surface of a first semiconductor chip 720.

The interposer 750 may be fabricated by cutting the interposer 100 (of FIGS. 2A and 2B) to size. Electrical connections from the second chip pads 731 via the interposer 750 to corresponding substrate pads 711 may be achieved in the same manner as those in the stacked chip package 500 of the previous example embodiment, and therefore a description of the same is omitted.

Figure 10A:
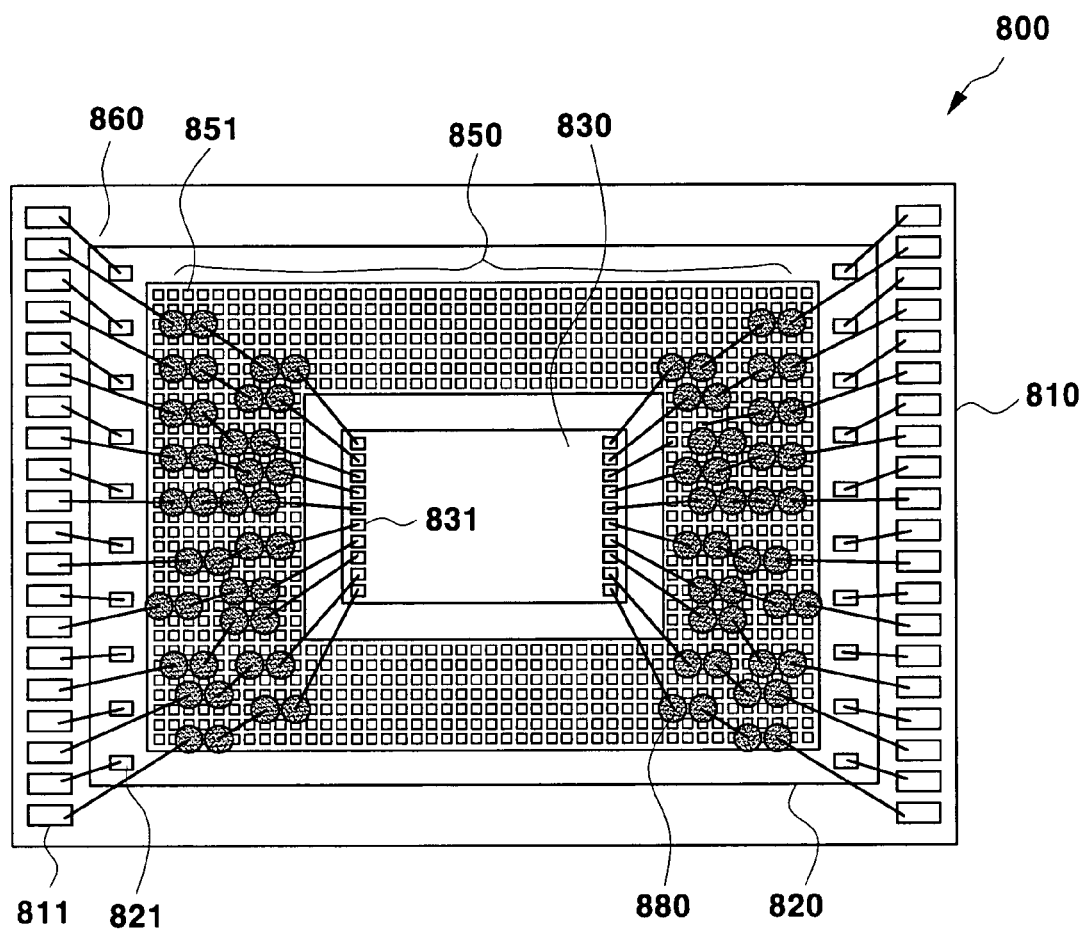
FIGS. 10A and 10B are top and sectional views of another modified example of the stacked chip package according to an example, non-limiting embodiment of the present invention.
Figure 10B:
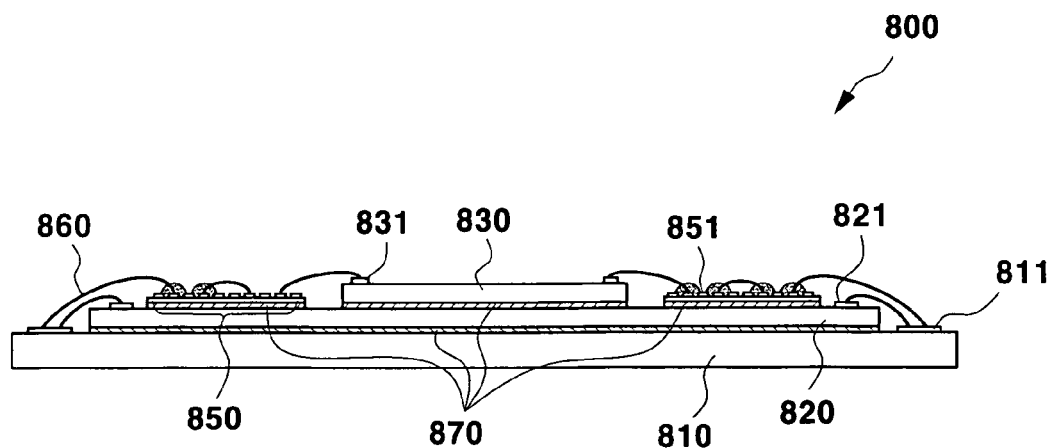

FIGS. 10A and 10B are top and sectional views of another modified example of the stacked chip package according to an example, non-limiting embodiment of the present invention.

The stacked chip package 800 shown in FIGS. 10A and 10B may include an interposer 850 and a second semiconductor chip 830 that may be mounted on a first semiconductor chip 820. The interposer 850 may surround the periphery of the second semiconductor chip 830.

For example, the interposer 850 may be fabricated by cutting the interposer 100 (of FIGS. 2A and 2B) to size, and providing a window in the interposer to receive the second semiconductor chip 830.

Electrical connections from the first chip pads 821 and the second chip pads 831 to corresponding substrate pads 811 may be achieved in the same manner as those in the stacked chip package 500 of the previous embodiment, and therefore a description of the same is omitted.

In the stacked chip packages 700 and 800 of the modified examples, the second semiconductor chips 730 and 830 may be stacked on the first semiconductor chips 720 and 820 (as opposed to the interposers 750 and 850), respectively, which may reduce the overall thickness of the stacked chip packages 700 and 800.

Example, non-limiting embodiments of the present invention may provide an interposer having a plurality of lands and a stacked chip package having an interposer that may be fabricated by cutting the interposer to size. Semiconductor chips to be stacked and a package substrate may be electrically interconnected through a plurality of lands provided on the interposer. As a result, the interposer can be utilized for stacked chip packages regardless of changes in fabrication conditions of the stacked chip packages.

In addition, the interposer may be produced on a large scale, and interposers for stacked chip packages may be fabricated by cutting the mass-produced interposer in desired sizes and/or shapes. In this way, the cumbersome and time consuming processes associated with producing custom interposers having specific bonding pads and/or connection wires according to conditions of individual stacked chip packages may be avoided. Also, manufacture costs may be reduced. Various stacked chip packages may be manufactured without custom interposer fabrication processes, simplifying overall manufacturing processes and/or enhancing manufacturing productivity, for example.

Example, non-limiting embodiments of the present invention have been described and shown in the accompanying drawings by way of illustration only. This disclosure is not intended to limit the scope of the invention, but to serve for illustrative purposes. It will be understood to the ordinary person skilled in the art that numerous and varied changes and/or modifications of the embodiments are possible without departing from the spirit and scope of the present invention as defined by the appended claims.

What is claimed is:

1. An interposer comprising:
a base substrate; and
a two dimensional array of conductive lands provided on a surface of the base substrate; the conductive lands being identical in shape and arranged at a uniform pitch in at least one direction;
wherein the two dimensional array of conductive lands is provided on the entire surface of the base substrate;
wherein the conductive lands have an identical size;
wherein the conductive lands are arranged at a uniform pitch in two directions that are perpendicular to each other;
wherein the uniform pitch is such that when one end of a connection member is bonded to a first conductive land, the first conductive land and a second conductive land adjacent to the first conductive land are electrically connected by the connection member, and
wherein the connection member is a bonding wire with a wire ball bonded to the first and the second conductive lands.

2. The interposer of claim 1, wherein the conductive lands are arranged in a lattice form on the entire surface of the base substrate.

3. The interposer of claim 1, wherein the conductive lands are square in shape.

4. The interposer of claim 1, wherein the conductive lands are circular in shape.

5. The interposer of claim 1, wherein the conductive lands are fabricated from metal.

6. The interposer of claim 1, wherein spaces between the conductive lands are filled with an insulating material.

7. The interposer substrate of claim 1, wherein the base substrate is fabricated from an insulating resin.

8. The interposer substrate of claim 1, wherein the base substrate is fabricated from a silicon wafer.

9. An interposer comprising:
a base substrate; and
a two dimensional array of conductive lands provided on a surface of the base substrate; the conductive lands being identical in shape and arranged at a uniform pitch in at least one direction,
wherein the at least one direction is parallel to one side of the base substrate,
wherein the conductive lands each include a first bonding portion, a second bonding portion and a connecting portion interconnecting the first bonding portion and second bonding portion; and
wherein the first bonding portion and the second bonding portion provide respective bonding locations for two different connection members, the two different connection members being a bonding wire with a wire ball and bonded to the respective first and the second bonding portions.

10. The interposer of claim 9, wherein the first bonding portion and second bonding portion are identical in shape and size, and the connecting portion interconnects the first bonding portion and second bonding portion.

11. The interposer substrate of claim 10, wherein the first bonding portion and the second bonding portion are one of rectangular and circular in shape.

12. The interposer substrate of claim 9, wherein the connection members are bonding wires.

13. A stacked chip package comprising:
a package substrate supporting a plurality of substrate pads;
a first semiconductor chip stacked on the package substrate and supporting first chip pads;
a second semiconductor chip stacked on the package substrate and supporting second chip pads;
an interposer and stacked on the package substrate, the interposer including:
a base substrate; and
a two dimensional array of conductive lands provided on a surface of the base substrate; the conductive lands being identical in shape and arranged at a uniform pitch in at least one direction; and
a plurality of connection members;
wherein some of the second chip pads are electrically connected to corresponding substrate pads via at least two of the connection members; and
wherein two of the at least two connection members are electrically interconnected through a first conductive land located between a second conductive land and a third conductive land by bonding one end of each of the two connection members to the second conductive land and the third conductive land, respectively, so that the ends of the two connection members contact with the first contact land.

14. The stacked chip package of claim 13, wherein some of the first chip pads are electrically connected to corresponding second chip pads via at least another two connection members; and
two of the at least another two connection members are electrically interconnected through a fourth conductive land located between a fifth conductive land and a sixth conductive land by bonding one end of each of the two connection members to the fifth conductive land and the sixth conductive land, respectively, so that the ends of the two connection members contact with the fourth conductive land.

15. The stacked chip package of claim 13, wherein the connection members are bonding wires, and ends of the bonding wires connected to the conductive lands are wire balls.

16. A stacked chip package comprising:
a package substrate supporting a plurality of substrate pads;
a first semiconductor chip stacked on the package substrate and supporting first chip pads;
a second semiconductor chip stacked on the package substrate and supporting second chip pads;
an interposer according to claim 9 and stacked on the package substrate; and
a plurality of connection members,
wherein some of the second chip pads are electrically connected to corresponding substrate pads via at least two of the connection members; and
wherein two of the at least two connection members are electrically interconnected by bonding one end of each of the two connection members to a first bonding portion and a second bonding portion, respectively, of an associated conductive land.

17. The stacked chip package of claim 16, wherein some of the first chip pads are electrically connected to corresponding second chip pads via at least another two connection members; and
two of the at least another two connection members are electrically interconnected by bonding one end of each of the two connection members to a first bonding portion and a second bonding portion, respectively, of an associated conductive land.

18. The stacked chip package of claim 16, wherein the first bonding portion and the second bonding portion are identical in shape and size.

19. The stacked chip package of claim 16, wherein the connection members are bonding wires.

20. The stacked chip package of claim 13, wherein the interposer is positioned between the first semiconductor chip and the second semiconductor chip.

21. The stacked chip package of claim 13, wherein the first semiconductor chip is mounted on the package substrate, and the interposer and the second semiconductor chip are mounted parallel to each other on the first semiconductor chip.

22. The stacked chip package of claim 13, wherein the interposer surrounds a periphery of the second semiconductor chip.

23. The stacked chip package of claim 13, wherein spaces between the conductive lands are filled with an insulating material.

24. The stacked chip package of claim 16, wherein the interposer is positioned between the first semiconductor chip and the second semiconductor chip.

25. The stacked chip package of claim 16, wherein the first semiconductor chip is mounted on the package substrate, and the interposer and the second semiconductor chip are mounted parallel to each other on the first semiconductor chip.

26. The stacked chip package of claim 16, wherein the interposer surrounds a periphery of the second semiconductor chip.

27. The stacked chip package of claim 16, wherein spaces between the conductive lands are filled with an insulating material.

* * * * *